(12) United States Patent
Jeong et al.

(10) Patent No.: US 7,868,327 B2
(45) Date of Patent: Jan. 11, 2011

(54) THIN FILM TRANSISTOR AND METHOD OF MANUFACTURING THE SAME

(75) Inventors: Jae Kyeong Jeong, Yongin-si (KR); Hyun Soo Shin, Yongin-si (KR); Se Yeoul Kwon, Yongin-si (KR); Yeon Gon Mo, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 159 days.

(21) Appl. No.: 11/508,530

(22) Filed: Aug. 22, 2006

(65) Prior Publication Data

US 2007/0108472 A1 May 17, 2007

(30) Foreign Application Priority Data

| Nov. 16, 2005 | (KR) | ................... 10-2005-0109826 |
| Nov. 29, 2005 | (KR) | ................... 10-2005-0115112 |
| Nov. 30, 2005 | (KR) | ................... 10-2005-0115969 |
| Dec. 9, 2005 | (KR) | ................... 10-2005-0120898 |

(51) Int. Cl.
*H01L 29/04* (2006.01)

(52) U.S. Cl. .......... 257/59; 257/E21.112; 257/E27.117; 257/E21.094; 257/E21.104; 438/49; 349/41; 349/42

(58) Field of Classification Search .......... 257/E21.112, 257/E27.117, E21.094, E21.104, 59; 438/49; 349/41, 42
See application file for complete search history.

(56) References Cited

U.S. PATENT DOCUMENTS

| 5,225,372 A | * | 7/1993 | Savkar et al. | ............... 438/653 |
| 5,950,077 A | * | 9/1999 | Ohue et al. | ................ 438/149 |
| 5,969,376 A | * | 10/1999 | Bao | ........................... 257/40 |

(Continued)

FOREIGN PATENT DOCUMENTS

| CN | 1285611 A | 2/2001 |
| CN | 1409373 A | 4/2003 |
| JP | 2000-058861 | 2/2000 |
| JP | 2001-094113 | 4/2001 |
| JP | 2003-068668 | 3/2003 |
| KR | 10-2002-0041782 A | 6/2002 |

OTHER PUBLICATIONS

Chinese Office Action in Application No. 200610138192.8 dated of Nov. 6, 2009 which corresponds to Korean Application Nos. 10-2005-0109826, 20-2005-0115112, 10-2005-0120898, and 10-2005-0115969.

(Continued)

*Primary Examiner*—David Vu
*Assistant Examiner*—Brandon Fox
(74) *Attorney, Agent, or Firm*—Knobbe Martens Olson & Bear, LLP.

(57) ABSTRACT

A thin film transistor (TFT) and a method of manufacturing the same, and more particularly, a TFT for reducing leakage current and a method of manufacturing the same are provided. The TFT includes a flexible substrate, a diffusion preventing layer formed on the flexible substrate, a buffer layer formed of at least two insulated materials on the diffusion preventing layer, a semiconductor layer formed on a region of the buffer layer to include a channel layer and a source and drain region, a gate insulating layer formed on the buffer layer including the semiconductor layer, a gate electrode formed on the gate insulating layer in a region corresponding to the channel layer, an interlayer insulating layer formed on the gate insulating layer including the gate electrode, and source and drain electrodes formed in the interlayer insulating layer to include a predetermined contact hole that exposes at least a region of the source and drain region and to be connected to the source and drain region.

7 Claims, 8 Drawing Sheets

U.S. PATENT DOCUMENTS

| | | | |
|---|---|---|---|
| 6,682,963 B2* | 1/2004 | Ishikawa | 438/149 |
| 6,765,249 B2* | 7/2004 | Voutsas et al. | 257/288 |
| 6,878,607 B2* | 4/2005 | Inoue et al. | 438/458 |
| 7,235,850 B2* | 6/2007 | Koo et al. | 257/408 |
| 2001/0041392 A1* | 11/2001 | Suzawa et al. | 438/149 |
| 2002/0086453 A1* | 7/2002 | Kim et al. | 438/30 |
| 2003/0047732 A1* | 3/2003 | Yamazaki et al. | 257/59 |
| 2004/0089878 A1* | 5/2004 | Takehashi et al. | 257/200 |
| 2004/0124451 A1* | 7/2004 | Oh et al. | 257/291 |
| 2005/0236623 A1* | 10/2005 | Takechi et al. | 257/66 |
| 2005/0282357 A1* | 12/2005 | Takayama et al. | 438/458 |

OTHER PUBLICATIONS

Japanese Office Action, issued Jun. 8, 2010, in corresponding Japanese Application No. 2006-221947, which also claims priority to priority Korean Application No. 10-2005-0109826.

* cited by examiner

THIN FILM TRANSISTOR AND METHOD OF MANUFACTURING THE SAME

CROSS-REFERENCE TO RELATED APPLICATIONS

This application claims the benefit of Korean Patent Application No. 10-2005-0109826, filed on Nov. 16, 2005; No. 10-2005-0115112, filed on Nov. 29, 2005; No. 10-2005-0115969, filed on Nov. 30, 2005; and No. 10-2005-0120898, filed on Dec. 9, 2005 in the Korean Intellectual Property Office, the disclosures of which are incorporated herein by reference.

BACKGROUND OF THE INVENTION

1. Field of the Invention

The present invention relates to a thin film transistor (TFT) and a method of manufacturing the same, and more particularly, to a thin film transistor (TFT).

2. Description of the Related Technology

In general, flat panel displays (FPD) such as organic light emitting displays (OLED) and thin film transistor liquid crystal displays (TFT-LCD) can be made flexible. In order to make a display flexible, a flexible substrate is used. The flexible substrate may be a plastic substrate or a metal foil substrate.

The plastic substrate is typically made of a synthetic resin. However, when a TFT is formed on the plastic substrate, the substrate may be deformed. Thin films formed on the substrate may also be deformed due to, for example, infliction of moisture and oxygen.

On the other hand, the metal foil substrate, such as stainless steel (SUS) or Ti, has less flexibility than the plastic substrate. However, in a TFT formed on the metal foil substrate, the organic light emitting layer does not deteriorate due to the transmission of moisture and oxygen. In addition, the metal foil substrate can undergo a high temperature process. Therefore, the metal foil substrate can be used for a TFT having a polysilicon semiconductor layer made by a high temperature process.

In general, in order to form TFTs on a conductive substrate, in particular, a conductive thin film formed of SUS or Ti, an insulating buffer layer may be used between the conductive thin film and the TFTs. The TFTs formed over the buffer layer on the conductive thin film has similar electrical and structural properties as silicon on insulator (SOI). At this time, the LTPS obtained by low temperature heating an amorphous silicon layer to crystallize the amorphous silicon layer or by excimer laser annealing the amorphous silicon layer is used as a semiconductor layer that forms the TFTs.

In manufacturing the conventional TFT, impurities such as Cr, Fe, Ni, and C of the substrate are diffused into the semiconductor layer through the buffer layer during a predetermined thermal annealing process performed on the LTPS.

SUMMARY OF CERTAIN INVENTIVE ASPECTS

One aspect of the invention provides an electronic device comprising a thin film transistor. The device comprises: a flexible substrate comprising a metallic sheet; a semiconductor layer formed over the flexible substrate, the semiconductor layer comprising a source region, a drain region and a channel region located between the source and drain regions; a gate electrode formed over the semiconductor layer; a gate insulating layer interposed between the gate electrode and the semiconductor layer; a source electrode contacting the semiconductor layer; a drain electrode contacting the semiconductor layer; a buffer layer interposed between the flexible substrate and the semiconductor layer; and a diffusion barrier comprising Ti or Ta and interposed between the flexible substrate and the buffer layer.

The metallic sheet may comprise one or more materials selected from the group consisting of stainless steel (SUS) and Ti. The diffusion barrier may comprise one or more materials selected from the group consisting of TiN, TaSiN, TiSiN and TiAlN. The diffusion barrier may have a thickness between about 100 nm and about 500 nm. The buffer layer may comprise one or more materials selected from the group consisting of $SiO_2$, SiNx and SiNO. The buffer layer may have a thickness between about 50 nm and about 2 μm. The buffer layer may comprise two or more layers, each comprising a material selected from the group consisting of $SiO_2$, SiNx and SiNO. The buffer layer may comprise a first layer comprising $SiO_2$ and a second layer comprising SiNx. The buffer layer may further comprise a third layer comprising $SiO_2$ and a fourth layer comprising SiNx. The semiconductor layer may comprise an organic semiconductor material.

Another aspect of the invention provides a method of making an electronic device comprising a thin film transistor. The method comprises: providing a flexible substrate comprising a metallic sheet; forming a diffusion barrier over the flexible substrate, the diffusion barrier comprising Ti or Ta; forming a buffer layer over the diffusion barrier; forming a semiconductor layer over the buffer layer; and subjecting the semiconductor layer to thermal annealing.

The metallic sheet may comprise one or more materials selected from the group consisting of stainless steel (SUS) and Ti. The diffusion barrier may comprise one or more materials selected from the group consisting of TiN, TaSiN, TiSiN and TiAlN. The buffer layer may comprise one or more materials selected from the group consisting of $SiO_2$, SiNx and SiNO. The buffer layer may comprise two or more layers, each comprising a material selected from the group consisting of $SiO_2$, SiNx and SiNO. The thermal annealing may be conducted at a temperature between about 350° C. and about 450° C. for a period of time between about 10 minutes and about 1 hour. The method may further comprise doping impurities into one or more portions of the semiconductor layer prior to subjecting the semiconductor layer to the thermal annealing.

The method may further comprise in sequence: forming a capping layer over the semiconductor layer; and forming a metal catalytic layer over the capping layer after forming the semiconductor layer and prior to subjecting the semiconductor layer to the thermal annealing. The metal catalytic layer may comprise at least one selected from the group consisting of Ni, Pd, Ti, Ag, Au, Al, Sn, Sb, Cu, Co, Mo, Cr, Ru, Rh, Cd, and Pt. The thermal annealing may comprise rapid thermal annealing (RTA).

Another aspect of the invention provides an electronic device made by the method described above.

Yet another aspect of the invention provides a thin film transistor (TFT) in which impurities such as metal ions of a flexible substrate are prevented from being diffused into a semiconductor layer thereby reducing leakage current and a method of manufacturing the same.

Another aspect of the invention provides a thin film transistor (TFT) comprising a flexible substrate, a diffusion preventing layer formed on the flexible substrate, a buffer layer formed of at least a double layer on the diffusion preventing layer, a semiconductor layer formed on a region of the buffer layer to include a channel layer and a source and drain region, a gate insulating layer formed on the buffer layer and the semiconductor layer, a gate electrode formed on the gate insulating layer in a region corresponding to the channel layer, an interlayer insulating layer formed on the gate insulating layer and the gate electrode, and source and drain electrodes formed in the interlayer insulating layer to include a predetermined contact hole that exposes at least a region of the source and drain region and to be connected to the source and drain region.

Another aspect of the invention provides a TFT comprising a flexible substrate, a three-phase amorphous diffusion preventing layer formed of nonmetal on the flexible substrate, a buffer layer formed on the diffusion preventing layer of at least a double layer, a semiconductor layer formed on a region of the buffer layer to include a channel layer and a source and drain region, a gate insulating layer formed on the buffer layer and the semiconductor layer, a gate electrode formed on the gate insulating layer in a region corresponding to the channel layer, an interlayer insulating layer formed on the gate insulating layer and the gate electrode, and source and drain electrodes formed in the interlayer insulating layer to include a predetermined contact hole that exposes at least a region of the source and drain region and to be connected to the source and drain region.

Yet another aspect of the invention provides a TFT comprising a flexible substrate, a diffusion preventing layer formed on the flexible substrate, a buffer layer formed of at least a double layer on the diffusion preventing layer, a semiconductor layer formed on a region of the buffer layer to include a channel layer and a source and drain region so that the source and drain region is activated by a rapid thermal annealing (RTA) method, a gate insulating layer formed on the buffer layer and the semiconductor layer, a gate electrode formed on the gate insulating layer in a region corresponding to the channel layer, an interlayer insulating layer formed on the gate insulating layer and the gate electrode, and source and drain electrodes formed in the interlayer insulating layer to include a predetermined contact hole that exposes at least a region of the source and drain region and to be connected to the source and drain region.

Another aspect of the invention provides a TFT comprising a flexible substrate, a multiple buffer layer formed of at least a double layer on the substrate, a semiconductor layer formed on the buffer layer to include a source and drain region, a channel region, and a low density doping region, a first insulating layer formed on the semiconductor layer, a gate electrode formed on the first insulating layer to correspond to the semiconductor layer, a second insulating layer formed on the gate electrode, and source and drain electrodes electrically connected to the semiconductor layer through a contact hole formed in the first insulating layer and the second insulating layer.

Another aspect of the invention provides a method of manufacturing a TFT. The method comprises the steps of forming a diffusion preventing layer on a flexible substrate, forming a buffer layer on the diffusion preventing layer of at least a double layer, forming an amorphous silicon layer on the buffer layer and crystallizing the amorphous silicon layer to a poly silicon layer to be patterned to a predetermined shape so that a semiconductor layer is formed, forming a gate insulating layer on the buffer layer and the semiconductor layer, forming a gate electrode on a region of the gate insulating layer, ion doping a remaining region excluding a region corresponding to the gate electrode of the semiconductor layer using the gate electrode as a mask so that the semiconductor layer is divided into a channel layer and a source and drain region, forming an interlayer insulating layer on the gate insulating layer and the gate electrode, performing a thermal annealing process in a furnace at a temperature of about 350° C. to about 450° C. for 10 minutes to 1 hour to activate the semiconductor layer, and providing a predetermined contact hole that exposes at least a region of the source and drain region to form source and drain electrodes to be connected to the source and drain region through the contact hole.

Another aspect of the invention provides a method of manufacturing a TFT, the method comprising the steps of providing a flexible substrate, forming a three-phase amorphous diffusion preventing layer formed of nonmetal on the flexible substrate, forming a buffer layer on the diffusion preventing layer, forming an amorphous silicon layer on the buffer layer, forming a capping layer on the amorphous silicon layer, forming a metal catalytic layer on the capping layer, performing a thermal annealing process on the substrate to crystallize the amorphous silicon layer to a poly silicon layer, removing the metal catalytic layer and the capping layer, patterning the poly silicon layer to form a semiconductor layer, and forming a gate insulating layer, a gate electrode, an interlayer insulating layer, and source and drain electrodes on the flexible substrate where the semiconductor layer is formed.

Yet another aspect of the invention provides a method of manufacturing a TFT, the method comprising the steps of forming a diffusion preventing layer on a flexible substrate, forming a buffer layer on the diffusion preventing layer of at least a double layer, forming an amorphous silicon layer on the buffer layer and crystallizing the amorphous silicon layer to a poly silicon layer to be patterned to a predetermined shape so that a semiconductor layer is formed, forming a gate insulating layer on the buffer layer and the semiconductor layer, forming a gate electrode on a region of the gate insulating layer, ion doping a remaining region excluding a region corresponding to the gate electrode of the semiconductor layer using the gate electrode as a mask so that the semiconductor layer is divided into a channel layer and an ohmic contact layer, forming an interlayer insulating layer on the gate insulating layer and the gate electrode, activating the semiconductor layer by a RTA method, and providing a predetermined contact hole that exposes at least a region of the ohmic contact layer to form source and drain electrodes to be connected to the ohmic contact layer through the contact hole.

Another aspect of the invention provides a method of manufacturing a TFT, the method comprising the steps of forming a buffer layer obtained by laminating at least two insulating layers on a flexible substrate, forming a patterned semiconductor layer on the buffer layer, forming a first insulating layer on the semiconductor layer, forming a gate electrode on the first insulating layer to pattern the gate electrode to correspond to the semiconductor layer, ion implanting low density impurities into the semiconductor layer pattern using the gate electrode as a mask to form a low density doping region, applying photoresist on the semiconductor layer, defining a contact hole doping region by photolithography, ion implanting high density impurities into the opened source and drain region to form a source and drain region, and removing the photoresist, forming a second insulating layer on the gate electrode, forming a contact hole that passes through the first insulating layer and the second insulating layer, depositing an electrode, and patterning a source electrode and a drain electrode.

BRIEF DESCRIPTION OF THE DRAWINGS

These and/or other objects and advantages of the invention will become apparent and more readily appreciated from the following description of the embodiments, taken in conjunction with the accompanying drawings of which.

DETAILED DESCRIPTION OF CERTAIN INVENTIVE EMBODIMENTS

Hereinafter, embodiments of the invention will be described with reference to the accompanying drawings.

FIGS. 1A to 1F illustrate a thin film transistor (TFT) according to a first embodiment and a method of manufacturing the same. Referring to FIGS. 1A to 1F, in the TFT, a diffusion preventing layer 110 is formed on a flexible substrate 100. At this time, the flexible substrate 100 may include a metal foil. The metal foil may include stainless steel (SUS) or Ti.

Figure 1A:
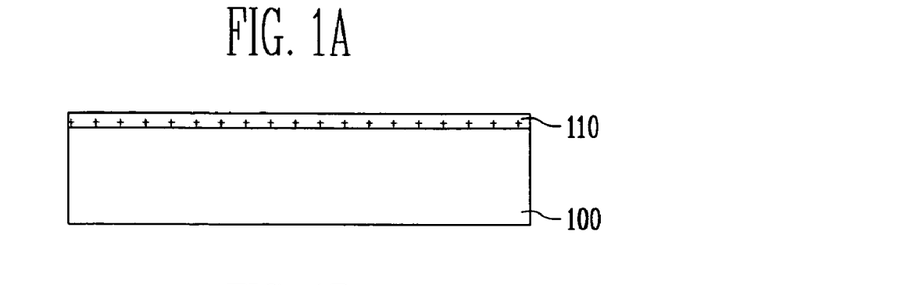
FIGS. 1A to 1G are sectional views illustrating a thin film transistor (TFT) according to a first embodiment and a method of manufacturing the same.

In one embodiment, the diffusion preventing layer 110 may be formed of TiN to a thickness of about 100 nm to about 400 nm. The diffusion preventing layer 110 is formed to prevent impurities such as Cr, Fe, Ni, and C from being diffused from the substrate 100 into a semiconductor layer 130 through a buffer layer 120 during a predetermined thermal annealing process (FIG. 1A).

Figure 1B:
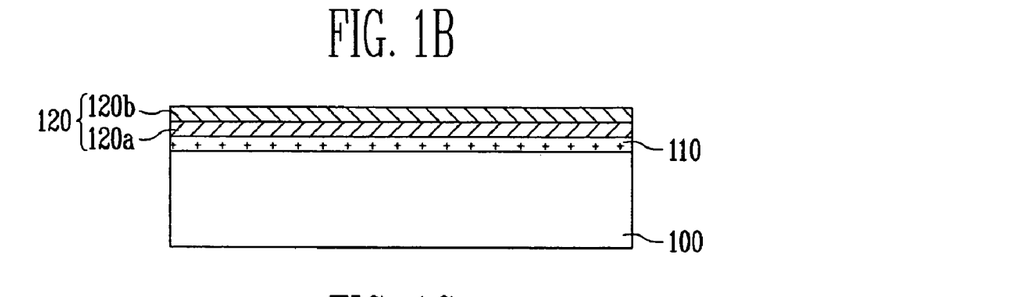

The buffer layer 120 is formed on the diffusion preventing layer 110. The buffer layer 120 is formed to prevent the flexible substrate 100 from being damaged by factors such as heat applied from the outside. In one embodiment, the buffer layer 120 may have a single layer. In another embodiment, the buffer layer 120 may have two or more layers so that the metal materials do not easily pass through the buffer layer 120. For example, the buffer layer 120 may have a first $SiO_2$ layer 120a and a first SiNx layer 120b which are laminated together. In one embodiment, the first $SiO_2$ layer 120a is formed to a thickness from about 200 nm to about 1 μm, and the first SiNx layer 120b is formed to a thickness from about 50 nm to about 200 nm. The positions of the first $SiO_2$ layer 120a and the SiNx layer 120b may be reversed.

Figure 1C:
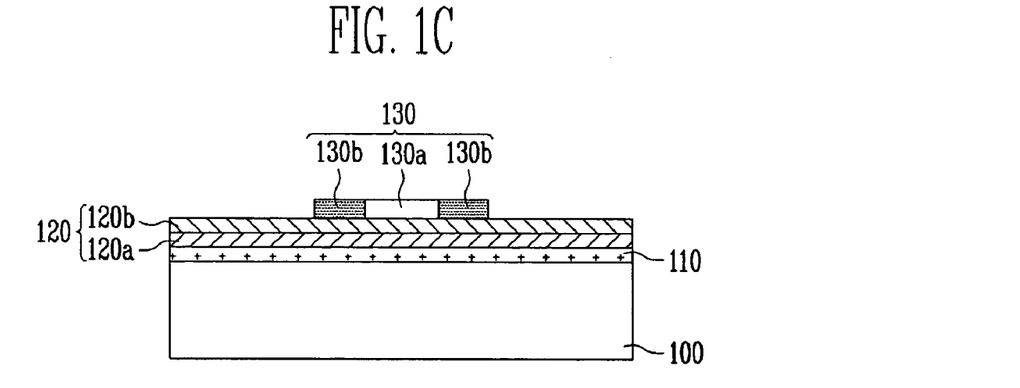
Figure 1D:
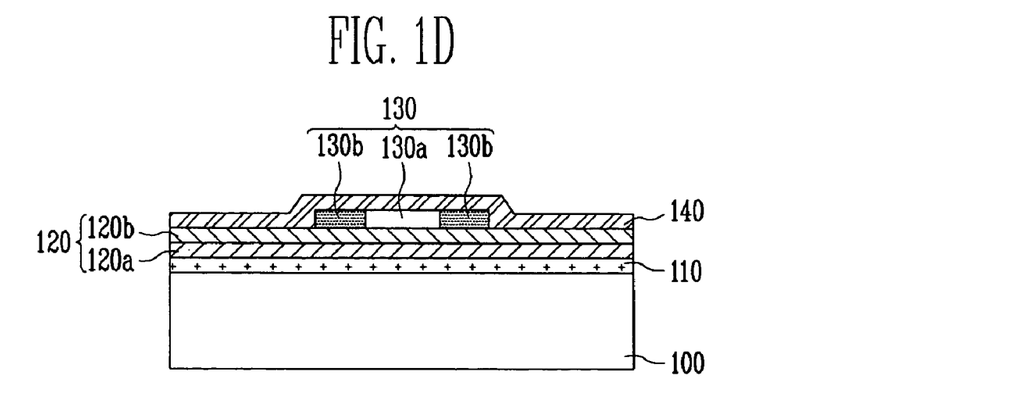
Figure 1E:
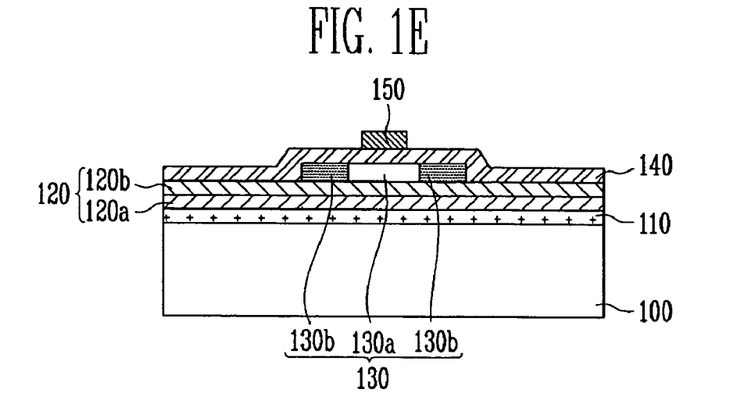
Figure 1F:
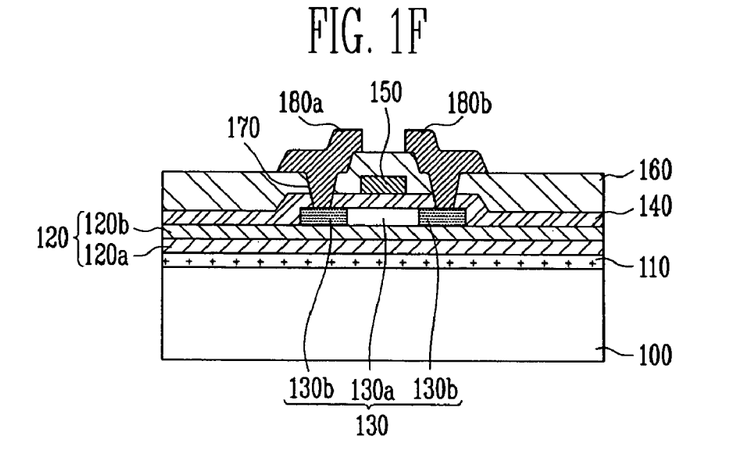
Figure 1G:
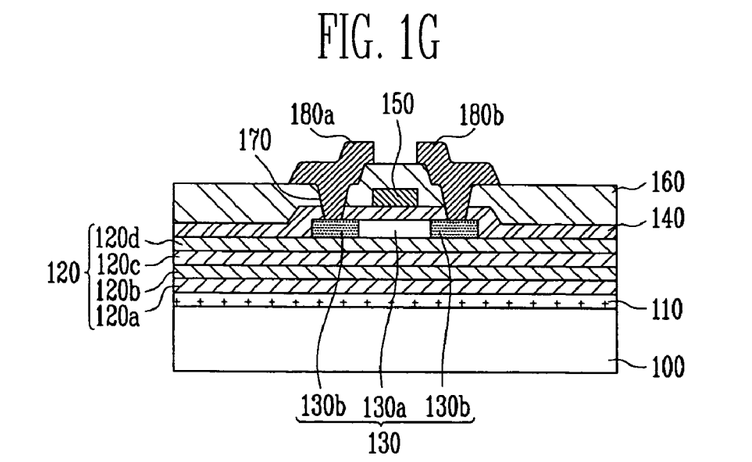

Also, as illustrated in FIG. 1G, the buffer layer 120 may be obtained by laminating a first $SiO_2$ layer 120a, a first SiNx layer 120b, a second $SiO_2$ layer 120c, and a second SiNx layer 120d. In one embodiment, the first $SiO_2$ layer 120a has a thickness from about 200 nm to about 1 μm. The first SiNx layer 120b may have a thickness from about 50 nm to about 200 nm. The second $SiO_2$ layer 120c may have a thickness of from about 50 nm to about 1 μm. The second SiNx layer 120d may have a thickness from about 50 nm to about 200 nm. The positions of the $SiO_2$ layers 120a and 120c and the SiNx layers 120b and 120d may be reversed (FIG. 1B).

Then, the semiconductor layer 130 including a channel layer 130a and a source and drain region 130b is formed on a region of the buffer layer 120. In one embodiment, the semiconductor layer 130 includes poly silicon. In order to form the poly silicon, first, an amorphous silicon layer is formed on the buffer layer 120. Then, after performing a dehydrogenating process by heating the amorphous silicon layer at a temperature of about 430° C. to remove the hydrogen component from the amorphous silicon layer, the dehydrogenated amorphous silicon layer is crystallized. In one embodiment, the amorphous silicon layer is crystallized using an excimer laser anneal (ELA) method. When the amorphous silicon layer is crystallized to a poly silicon layer, the crystallized poly silicon layer is patterned to form the semiconductor layer 130 (FIG. 1C).

Then, a gate insulating layer 140 is formed on the buffer layer 120 and the semiconductor layer 130 (FIG. 1D). A metal layer (not shown) is formed on the gate insulating layer 140 and the metal layer is patterned to form a gate electrode 150 (FIG. 1E). Then, the remaining region excluding the channel layer 130a from the semiconductor layer 130 is doped with an n-type dopant (n+) or a p-type dopant (p+) using the gate electrode 150 as a mask.

Next, an interlayer insulating layer 160 is formed on the buffer layer 120 and the gate electrode 150 and the semiconductor layer 130. After forming the interlayer insulating layer 160, an activation process is performed on the semiconductor layer 130. On the other hand, when the amorphous semiconductor layer 130 is crystallized to form a poly semiconductor layer and the poly semiconductor layer 130 is doped with ion shower, high energy dopants collide with barrier ribs to damage annealed silicon barrier ribs. Therefore, the semiconductor layer 130 becomes an amorphous semiconductor layer and interstitial doping atoms exist so that the dopant does not function well. Therefore, the thermal annealing process is performed to anneal the semiconductor layer 130 so that the dopant becomes substitutional, which is referred to as the activation process. At this time, the activation process is performed in a furnace at a temperature from about 350° C. to about 450° C. for 10 minutes to 1 hour.

Then, a contact hole 170 that exposes the source and drain region 130b through the interlayer insulating layer 160 is formed. In a subsequent process, source and drain electrodes 180a and 180b electrically connected to the source and drain region 130b through the contact hole 170 are formed (FIG. 2F).

In the above-described processes of manufacturing the TFT, high thermal annealing is required for the activation process of the semiconductor layer 130. At this time, the distance by which the impurities such as the metal ions of the flexible substrate 100 are diffused into the semiconductor layer 130 may be represented by EQUATION 1.

$$x=(D_0\exp(-E^*/RT)t)^{1/2} \qquad \text{Equation 1}$$

wherein, x, $D_0$, t, T, and $E^*$ represent a diffusion distance, a constant, a diffusion time, a temperature, and an energy barrier, respectively.

It is noted from EQUATION 1 that the diffusion distance x is exponentially proportionate to the temperature T and is proportionate to the time $t^{1/2}$. Therefore, it is possible to reduce the diffusion distance x of the impurities by reducing the temperature T and the time at which and for which the activation process is performed.

Figure 2A:
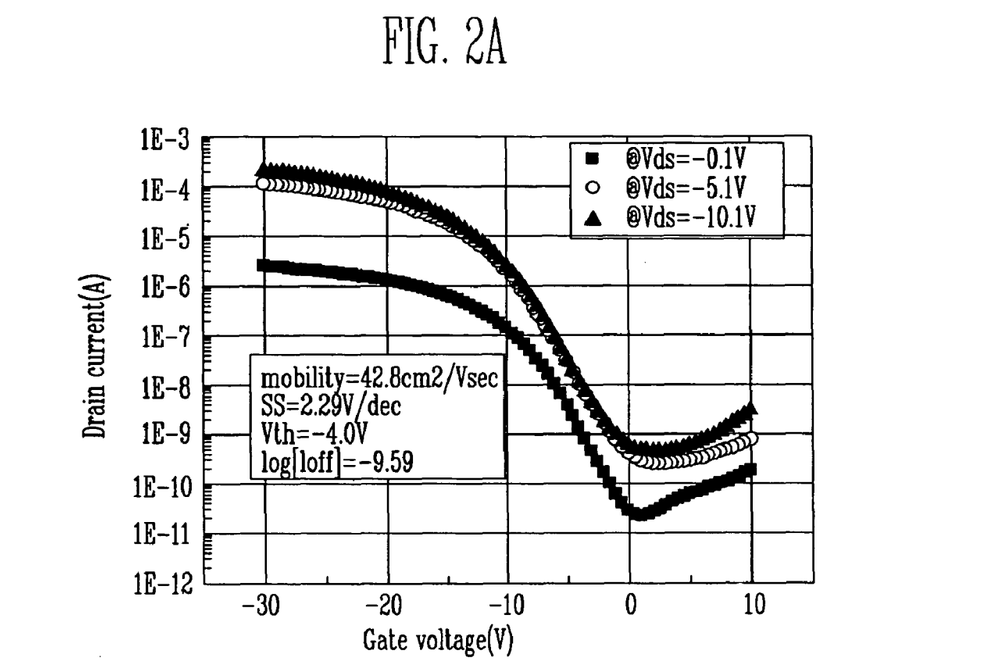
FIGS. 2A to 2C are sectional views illustrating a leakage current property according to the first embodiment.
Figure 2B:
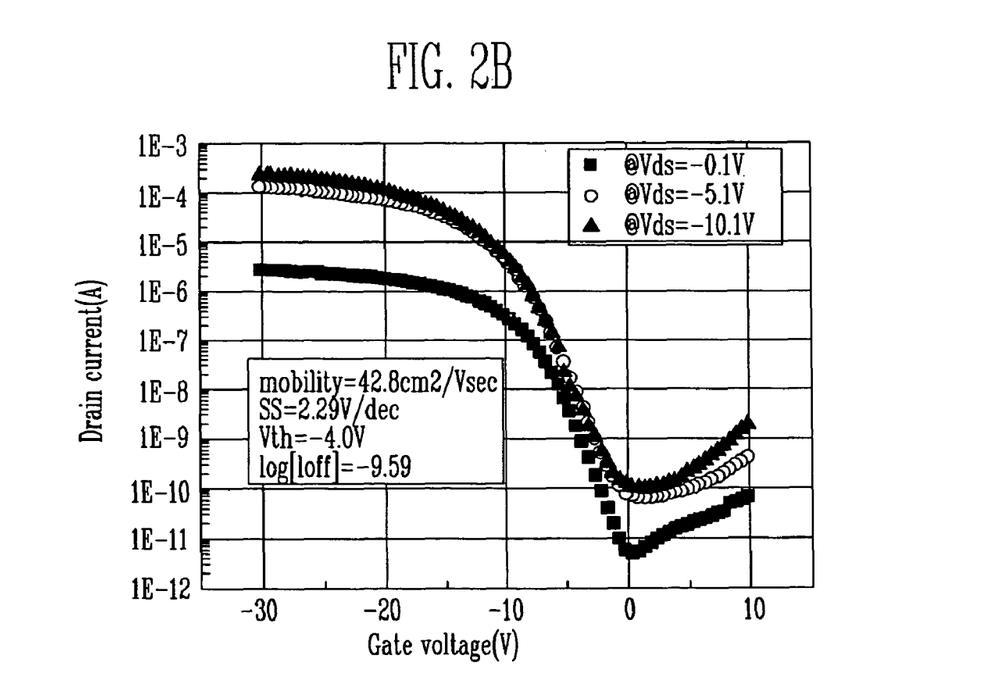
Figure 2C:
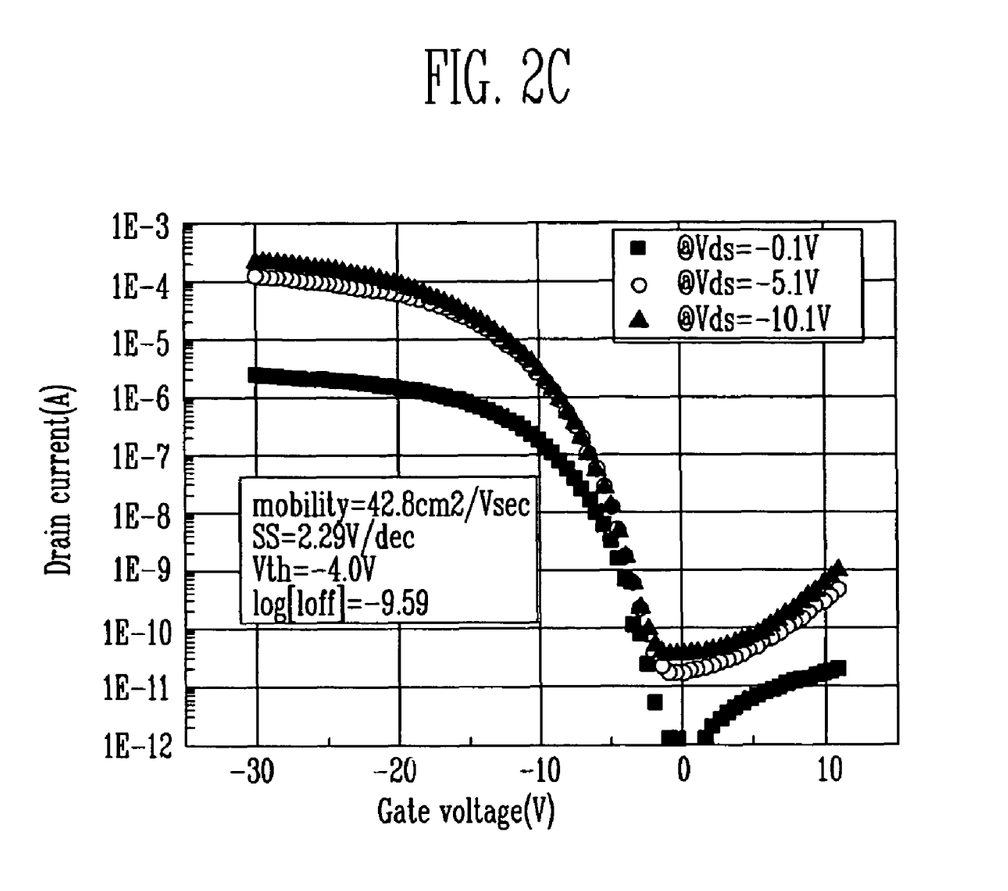

FIGS. 2A to 2C are sectional views illustrating a leakage current property according to a first embodiment. TABLE 1 illustrates display data of FIGS. 2A to 2C. TABLE 1 will be described with reference to FIGS. 2A to 2C.

TABLE 1

| activation condition | Mobility (cm²/Vs) | s-factor | $I^{off, min}$ | Vth (V) |
|---|---|---|---|---|
| 450° C., 2 hr | 43.0 | 2.19 | $1.160e^{-11}$ | −3.7 |
| 400° C., 2 hr | 38.0 | 1.65 | $6.31e^{-12}$ | −4.6 |
| 400° C., 0.5 hr | 49.3 | 1.08 | $2.51e^{-12}$ | −5.0 |

It is noted from FIGS. 2A to 2C and TABLE 1 that the leakage current is $1.160e^{-11}$ when the process of activating the semiconductor layer is performed at the temperature of 450° C. for 2 hours. The leakage current is $6.31e^{-12}$ when the process of activating the semiconductor layer is performed at the temperature of 400° C. for 2 hours. Also, the leakage current is $2.51e^{-12}$ when the process of activating the semiconductor layer is performed at the temperature of 400° C. for 30 minutes. That is, the leakage current is smallest when the process of activating the semiconductor layer is performed at the temperature of 400° C. for 30 minutes as illustrated in FIG. 2C. In one embodiment, annealing may be performed at a temperature of about 400° C. for about 30 minutes to reduce a leakage current.

FIGS. 3A to 3D are sectional views illustrating a TFT according to a second embodiment. Referring to FIGS. 3A to 3D, first, a flexible substrate 200 is provided. In one embodiment, the flexible substrate 200 is formed of SUS or Ti.

Figure 3A:
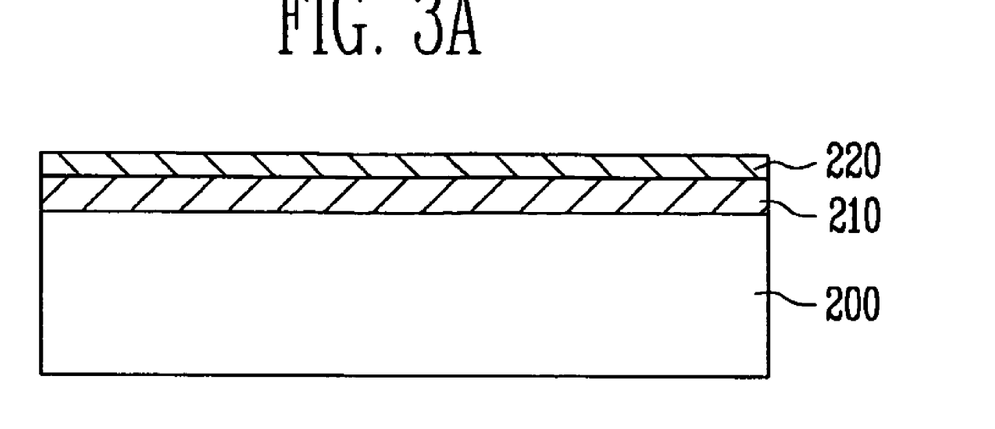
FIGS. 3A to 3D are sectional views illustrating a TFT according to a second embodiment and a method of manufacturing the same.

Then, a diffusion preventing layer or diffusion barrier layer 210 is formed on the flexible substrate 200. In one embodiment, the diffusion preventing layer 210 may be formed of a three-phase amorphous material, such as TaSiN or TiSiN. The diffusion barrier layer 210 may be formed by a sputtering method to a thickness of about 100 nm to about 500 nm.

A buffer layer 220 is formed on the diffusion preventing layer 210. The buffer layer 220 is formed of one of SiO₂, SiNx, and SiO₂/SiNx. In one embodiment, the buffer layer 220 may be formed by the sputtering method. In one embodiment, the buffer layer 220 has a thickness of about 50 nm to about 200 nm. The buffer layer 220 may prevent impurities from being diffused from the flexible substrate 200 into the semiconductor layer. The buffer layer 220 may also control the speed at which heat is transmitted during super grained Si (SGS) annealing so that a semiconductor layer 230 is successfully annealed (FIG. 3A).

Then, the semiconductor layer 230 is formed on the buffer layer 220. First, the semiconductor layer 230 is formed of amorphous silicon. Then, a dehydrogenation process is performed so that hydrogen does not reside in the amorphous silicon layer.

A capping layer 240 is formed on the semiconductor layer 230. The capping layer 240 is formed of one of SiO₂, SiNx, and SiO₂/SiNx. In one embodiment, the capping layer 240 may be formed by a plasma enhanced chemical vapor deposition (PECVD) method and the sputtering method. In one embodiment, the capping layer 240 may have a thickness of about 50 nm to about 200 nm. The capping layer 240 may selectively diffuse or penetrate Ni from a metal catalytic layer 250 which will be formed in a subsequent process to the interface between the semiconductor layer 230 and the capping layer 240.

The metal catalytic layer 250 is formed on the capping layer 240. The metal catalytic layer 250 may be formed on the capping layer 240. The metal catalytic layer 250 is deposited with Ni that is an annealing induction material. A surface density of Ni may be between about $10^{13}$ and about $10^{14}$ atoms/cm². Ni of the metal catalytic layer 250 serves as the annealing induction material, and forms a seed that is a core of annealing on the interface of the semiconductor layer 230 to form a grain. In the illustrated embodiment, Ni is used as the metal catalytic layer 250. In other embodiments, the metal catalytic layer 250 may include at least one selected from the group consisting of Ni, Pd, Ti, Ag, Au, Al, Sn, Sb, Cu, Co, Mo, Cr, Ru, Rh, Cd, and Pt (FIG. 3A).

Figure 3B:
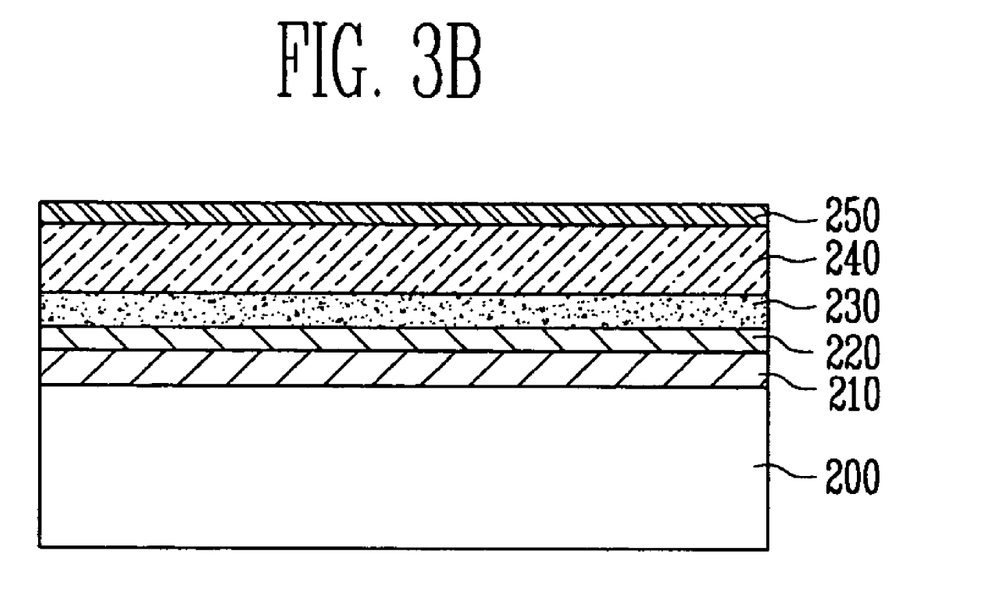

Then, the flexible substrate 200 is heated by a heating device such as a furnace and a rapid thermal annealing (RTA) process or laser. The thermal annealing process is performed to diffuse or penetrate Ni that is the annealing induction material of the metal catalytic layer 250 to move Ni to the interfaces of the capping layer 240 and the semiconductor layer 230. Therefore, a seed 231 is formed so that the amorphous silicon layer is crystallized to a poly silicon layer having a grain 232 by the seed 231.

As described above, the amorphous silicon layer may be crystallized to the poly silicon layer by an SGS method in which the capping layer and the metal catalytic material are formed on the amorphous silicon layer to be annealed. In such an embodiment, the size of the grains is between several microns and several hundred microns and the grains are very rough. Also, a grain boundary that operates as a barrier that prevents electrons or holes from moving is formed in the grain so that the electrons or holes can easily move therethrough as the size of the grain increases and that the speed of the electrons or holes may increase.

Figure 3C:
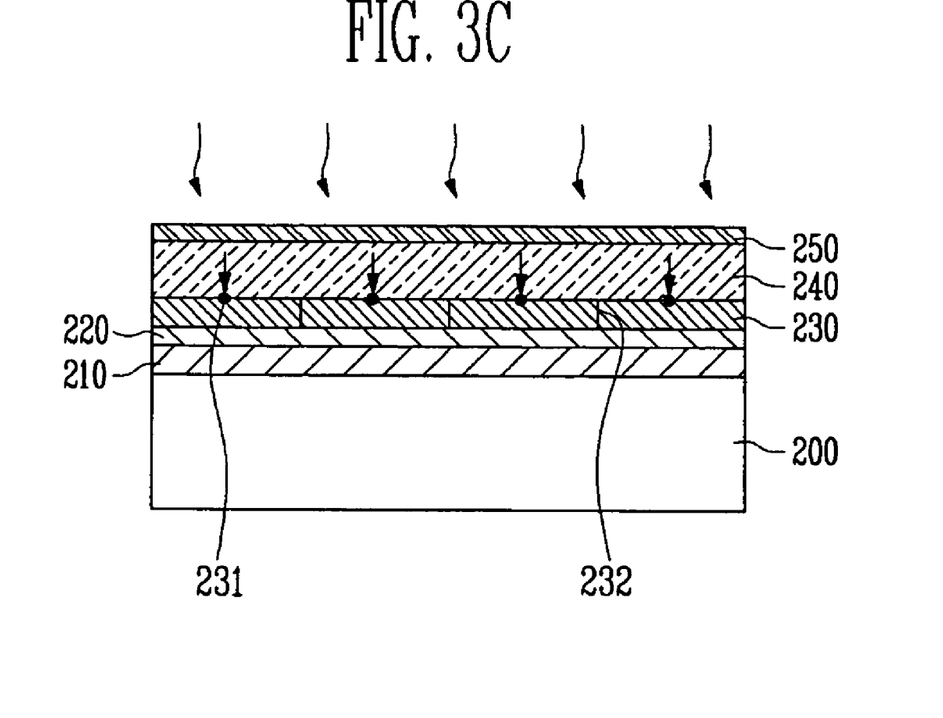

After crystallizing the amorphous silicon layer to the poly silicon layer through the thermal annealing process, the capping layer 240 and the metal catalytic layer 250 are removed (FIG. 3C).

Figure 3D:
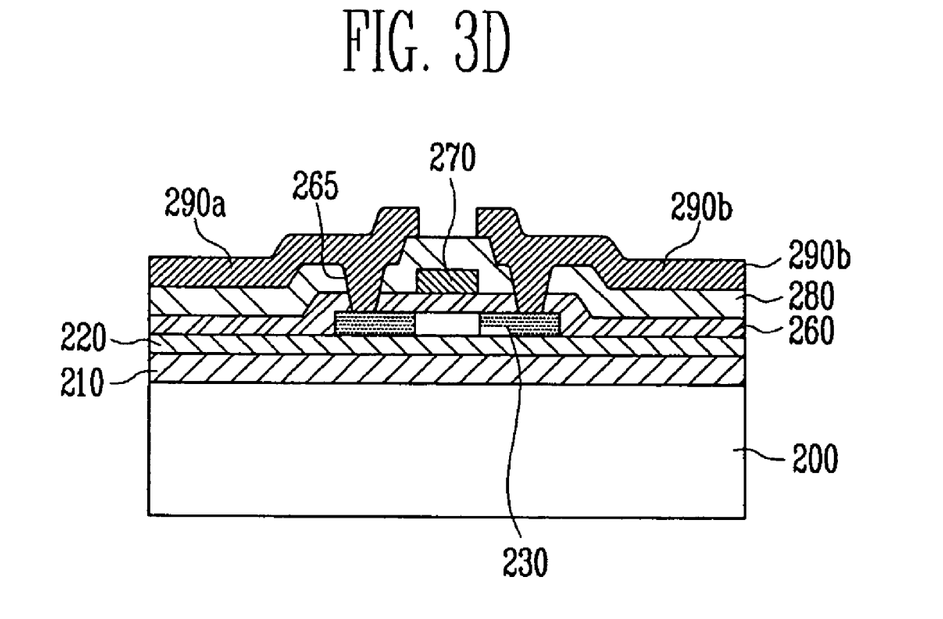

Then, the semiconductor layer 230 is patterned and a gate insulating layer 260 is formed on the semiconductor layer 230. At this time, the gate insulating layer 260 may be formed of an oxide film or a nitride film by the PECVD method. In one embodiment, the gate insulating layer 260 may be formed to a thickness of about 500 to about 1,000 Å.

A gate electrode 270 is formed on the gate insulating layer 260. The gate electrode 270 is formed on the gate insulating layer 260 of one conductive metal selected from the group consisting of Al, Mo, Ta, Cr, Ti, and Cu by the sputtering method. In one embodiment, the gate electrode 270 may be formed to a thickness of about 2,000 to about 4,000 Å and is patterned to a predetermined shape.

Then, an interlayer insulating layer 280 is formed on the gate electrode 270. The interlayer insulating layer 280 may be formed of the same material and by the same method as the material and method of which and by which the gate insulating layer 260 is formed.

Source and drain electrodes 290a and 290b are formed on the interlayer insulating layer 280 to be electrically connected to the source and drain region 230b of the semiconductor layer 230 through a contact hole 265 formed in the gate insulating layer 270 and the interlayer insulating layer 280. The source and drain electrodes 290 may be formed by applying photoresist on the metal layer to be patterned to a predetermined shape (FIG. 3D).

Figure 4A:
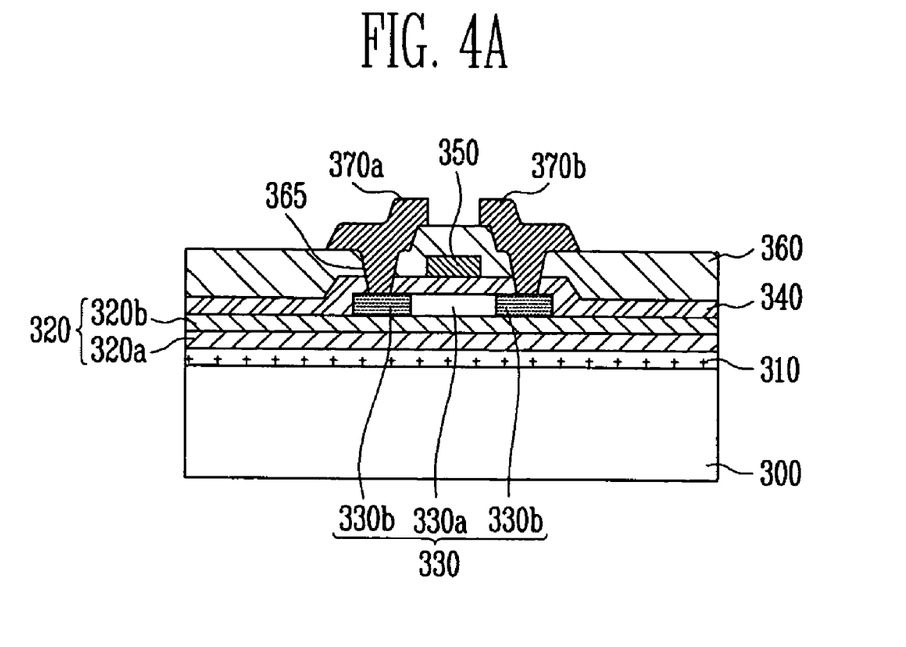
FIGS. 4A and 4B are sectional views illustrating a TFT according to a third embodiment and a method of manufacturing the same.
Figure 4B:
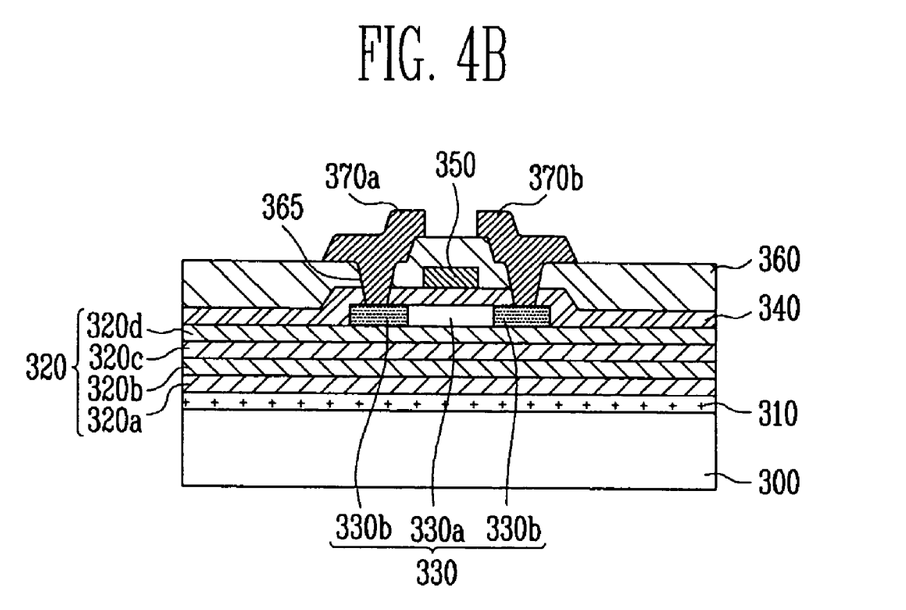

FIGS. 4A and 4B are sectional views illustrating a TFT according to a third embodiment. Referring to FIGS. 4A and 4B, the TFT includes a flexible substrate 300, a diffusion preventing layer 310, a buffer layer 320, a semiconductor layer 330, a gate insulating layer 340, a gate electrode 350, an interlayer insulating layer 360, and source and drain electrodes 370a and 370b.

Since the configuration of this embodiment is the same as that of the embodiment described above with reference to FIGS. 1A to 1F except for the process of activating the semiconductor layer 330, only the activation process will be described below. The process of activating the semiconductor layer 330 is performed by a rapid thermal annealing (RTA) method at a temperature from about 500° C. to about 650° C. for about 30 seconds to about 2 minutes. The RTA method may be performed using an IR lamp. When a metal substrate is instantaneously heated, the metal substrate can be thermally annealed without being damaged within several seconds even at a temperature more than a metal distortion point.

The buffer layer 320 may be obtained by laminating a first $SiO_2$ layer 320a and a first SiNx layer 320b as illustrated in FIG. 4A. In another embodiment, the buffer layer 320 may be obtained by laminating the first $SiO_2$ layer 320a, the first SiNx layer 320b, a second $SiO_2$ layer 320c, and a second SiNx layer 320d as illustrated in FIG. 4B. In one embodiment, the first $SiO_2$ layer 320a is formed to a thickness of about 200 nm to about 1 μm. The first SiNx layer 320b may be formed to a thickness of about 50 nm to about 200 nm. The second $SiO_2$ layer 320c may be formed to a thickness of about 50 nm to about 1 μm. The second SiNx layer 320d may be formed to a thickness of about 50 nm to about 200 nm. The positions of the $SiO_2$ layers 320a and 320c and the SiNx layers 320b and 320d may be reversed.

Figure 5A:
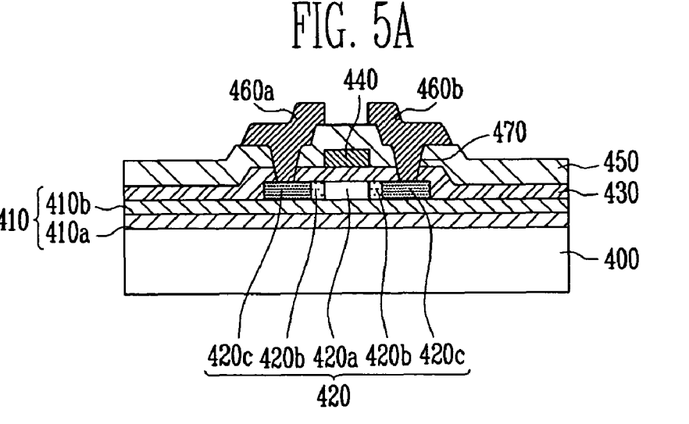
FIGS. 5A to 5C are sectional views illustrating a TFT according to a fourth embodiment.
Figure 5B:
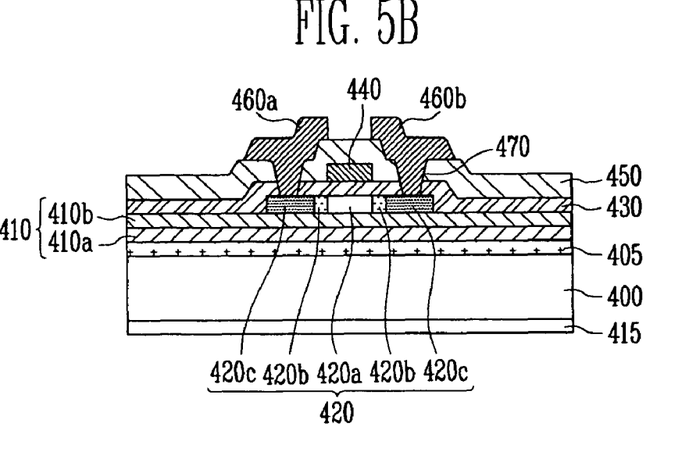
Figure 5C:
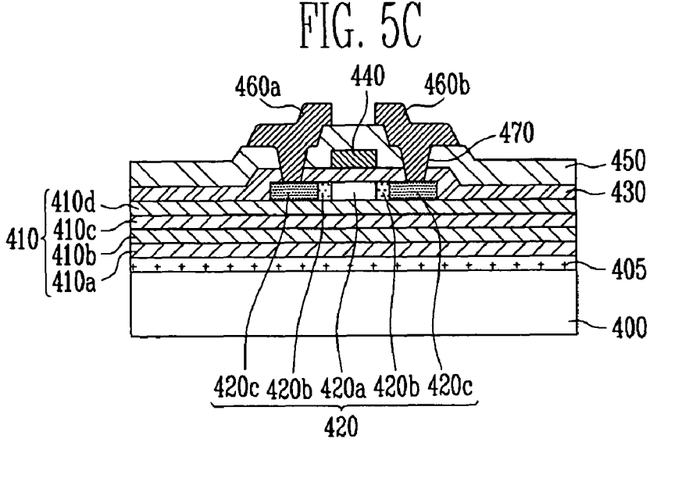

FIGS. 5A to 5C are sectional views illustrating a TFT according to a fourth embodiment. Referring to FIGS. 5A to 5C, the TFT includes a flexible substrate 400, a buffer layer 410, a semiconductor layer 420, a first insulating layer 430, a gate electrode 440, a second insulating layer 450, and source and drain electrodes 460a and 460b.

In one embodiment, the flexible substrate is formed of metal foil such as SUS or Ti. When the flexible substrate 400 is formed of the metal foil such as SUS, a buffer layer 120 that prevents impurities from being diffused is formed subsequent to forming of the TFT.

In one embodiment, the buffer layer 410 has two or more layers over the flexible substrate 400. The buffer layer 410 prevents the impurities from being diffused into the semiconductor layer 420 in a process of converting the amorphous silicon layer formed on the flexible substrate 400 into the poly silicon layer using one (for example, the ELA method) of various annealing methods. The buffer layer 410 is formed of $SiO_2$ and SiNx layers 410a and 410b so that the $SiO_2$ layer 410a is formed to a thickness of about 200 nm to about 1 μm and the SiNx layer 410b is formed to a thickness of about 50 nm to about 200 nm. In another embodiment, the positions of the $SiO_2$ layer 410a and the SiNx layer 410b may be reversed.

The semiconductor layer 420 is formed on the buffer layer 410 of an amorphous silicon layer (not shown) so that the amorphous silicon layer is crystallized to the poly silicon layer using various annealing methods. In one embodiment, the LTPS is formed using the ELA method. The poly silicon layer formed by the annealing process is patterned to form the semiconductor layer 420. Also, after forming the gate electrode 430 in a subsequent process, low density impurities are doped into the semiconductor layer 420 with a concentration of about $10^{11}$ to about $10^{12}$ ions/cm² per unit area using the gate electrode 430 as a mask to form a low density doping region 420b. Hereinafter, the low density doping region 420b is referred to as a lightly doped drain (LDD).

After forming the LDD 420b, a photoresist (not shown) is applied to define a contact hole doping region by photolithography. Then, after high density impurities are doped into the source and drain regions 420c of the semiconductor layer 420 to about $10^{11}$ to about $10^{12}$ ions/cm² per unit area, the photoresist is removed. Therefore, the highly doped source and drain region 420c and the LDD 420b are formed in the semiconductor layer 420. The resulting semiconductor layer 420 includes a channel region 420a which is substantially free of impurities, the LDD 420b, and the source and drain regions 420c for receiving an electrical signal.

The LDD 420b of the semiconductor layer 420 prevents unexpected impurities from deteriorating the property of the TFT even if the impurities are diffused from the flexible substrate 100 into the channel region 420a. Also, since the LDD 420b is separated from the gate electrode 440, the influence of the electric field applied from the source and drain region 420c having a uniform electric potential to the gate electrode 440 is reduced. Therefore, the leakage current that flows between the source and drain region 420c when the TFT is in an off state is reduced, which improves the off current property of the TFT.

The first insulating layer 430 is formed on the semiconductor layer 420. The first insulating layer 430 insulates the semiconductor layer 420 and the gate electrode 440 from each other. In one embodiment, an oxide film or a nitride film is used as an insulating material of the first insulating layer 430. However, it is not limited to the above.

The gate electrode 440 is formed on the first insulating layer 430. The gate electrode 440 is formed on the channel region 420a of the semiconductor layer 420 in a predetermined pattern. The gate electrode 440 may be formed of one selected from the group consisting of Al, MoW, Mo, Cu, Ag, an Ag alloy, an Al alloy, and ITO. However, it is not limited to the above.

The second insulating layer 450 is formed on the first insulating layer 430 and the gate electrode 440. The second insulating layer 450 may be formed of the same material as the first insulating layer 430.

Source and drain electrodes 460a and 460b are formed on the second insulating layer 450 to be electrically connected to the source and drain region 430c of the semiconductor layer 420 through a contact hole 470 formed in the first insulating layer 430 and the second insulating layer 450 (FIG. 5A).

On the other hand, a diffusion preventing layer 405 may be further formed between the flexible substrate 400 and the buffer layer 410. The diffusion preventing layer 405 effectively prevents impurities from being diffused into the semiconductor layer 420 through the flexible substrate 400 when the amorphous silicon layer is crystallized to the poly silicon layer. In one embodiment, the diffusion preventing layer 405 is formed of TiN, TiAlN, and TaSiN to a thickness of about 1 nm to about 400 nm. Also, a third insulating layer 415 may be further formed to prevent unexpected voltage and external noise from being received from the outside through the bottom surface of the flexible substrate 400. Therefore, even if the impurities are diffused from the flexible substrate 100 into the channel region 420a, the LDD 420b prevents the property of the TFT from deteriorating (FIG. 5B).

The buffer layer 410 may also have $SiO_2$ and SiNO layers 410c and 410d formed over the $SiO_2$ and SiNx layers 410a and 410b. In one embodiment, the $SiO_2$ layer 410c may be formed to a thickness of about 50 nm to about 1 μm. The SiNo layer 410d may be formed to a thickness of about 50 nm to about 200 nm (FIG. 5C).

According to the embodiments described above, the diffusion preventing layer and the buffer layer obtained by laminating at least two layers are included and the activation process temperature and time are reduced. This configuration prevents impurities of the flexible substrate from being diffused into the semiconductor layer during the process of activating the semiconductor layer. Thus, a leakage current can be reduced.

Although a few embodiments of the present invention have been shown and described, it would be appreciated by those skilled in the art that changes might be made in this embodi-

What is claimed is:

1. An electronic device, comprising:
a thin film transistor;
a flexible substrate comprising a metallic sheet;
a semiconductor layer formed over the flexible substrate, the semiconductor layer comprising a source region, a drain region and a channel region located between the source and drain regions;
a gate electrode formed over the semiconductor layer;
a gate insulating layer interposed between the gate electrode and the semiconductor layer;
a source electrode contacting the semiconductor layer;
a drain electrode contacting the semiconductor layer;
a buffer layer interposed between the flexible substrate and the semiconductor layer, the buffer layer comprising one or more materials selected from the group consisting of $SiO_2$, SiNx and SiNO, wherein the buffer layer comprises at least first, second, third, and fourth sequentially stacked sub-layers, wherein the first and third sub-layers are formed of a first material, and the second and fourth sub-layers are formed of a second material, wherein the first and second materials are different from one another in composition; and
a diffusion barrier comprising Ti or Ta and interposed between the flexible substrate and the buffer layer, wherein the diffusion barrier is a single layer that contacts both the flexible substrate and the buffer layer, and wherein the diffusion barrier is configured to prevent impurities from diffusing from the substrate into the semiconductor layer.

2. The device of claim 1, wherein the metallic sheet comprises one or more materials selected from the group consisting of stainless steel (SUS) and Ti.

3. The device of claim 1, wherein the diffusion barrier comprises one or more materials selected from the group consisting of TiN, TaSiN, TiSiN and TiAlN.

4. The device of claim 1, wherein the diffusion barrier has a thickness between about 100 nm and about 500 nm.

5. The device of claim 1, wherein the buffer layer has a thickness between about 50 nm and about 2 μm.

6. The device of claim 1, wherein the first material is $SiO_2$ and the second material is SiNx.

7. The device of claim 1, wherein the semiconductor layer comprises an organic semiconductor material.

* * * * *

UNITED STATES PATENT AND TRADEMARK OFFICE
CERTIFICATE OF CORRECTION

PATENT NO. : 7,868,327 B2
APPLICATION NO. : 11/508530
DATED : January 11, 2011
INVENTOR(S) : Jae Kyeong Jeong et al.

Page 1 of 1

It is certified that error appears in the above-identified patent and that said Letters Patent is hereby corrected as shown below:

At column 10, page 16, line 43, please delete "1", and insert --100--, therefor.

Signed and Sealed this
Twenty-sixth Day of July, 2011

David J. Kappos
*Director of the United States Patent and Trademark Office*